US006559017B1

(12) United States Patent
Brown et al.

(10) Patent No.: US 6,559,017 B1
(45) Date of Patent: May 6, 2003

(54) METHOD OF USING AMORPHOUS CARBON AS SPACER MATERIAL IN A DISPOSABLE SPACER PROCESS

(75) Inventors: David E. Brown, Austin, TX (US); Philip A. Fisher, Foster City, CA (US); Richard J. Huang, Cupertino, CA (US); Richard C. Nguyen, Fremont, CA (US); Cyrus E. Tabery, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/170,909

(22) Filed: Jun. 13, 2002

(51) Int. Cl.$^7$ .............................................. H01L 21/336
(52) U.S. Cl. ...................... 438/302; 438/304; 438/305; 438/306; 438/307; 438/308
(58) Field of Search ................................. 438/199, 302, 438/304, 305, 306, 307, 308

(56) References Cited

U.S. PATENT DOCUMENTS

| 5,661,340 | A | * | 8/1997 | Ema et al. .................... 257/680 |
| 5,985,726 | A | | 11/1999 | Yu et al. |
| 6,214,655 | B1 | * | 4/2001 | Lee et al. .................... 438/199 |
| 6,271,095 | B1 | | 8/2001 | Yu |
| 6,335,253 | B1 | * | 1/2002 | Chong et al. ................ 438/305 |

* cited by examiner

Primary Examiner—David Nelms
Assistant Examiner—Rene' R. Berry
(74) Attorney, Agent, or Firm—Foley & Lardner

(57) ABSTRACT

A method of using amorphous carbon as spacer material in a disposable spacer process can include forming amorphous carbon spacers at lateral side walls of a gate structure over a substrate, implanting dopants in the substrate to form source and drain regions, ashing away the amorphous carbon spacers, and implanting dopants to form shallow structures in the substrate.

20 Claims, 2 Drawing Sheets

METHOD OF USING AMORPHOUS CARBON AS SPACER MATERIAL IN A DISPOSABLE SPACER PROCESS

FIELD OF THE INVENTION

The present disclosure relates generally to integrated circuits and methods of manufacturing integrated circuits. More particularly, the present disclosure relates to a method of using amorphous carbon as spacer material in a disposable spacer process.

BACKGROUND OF THE INVENTION

Integrated circuits (ICs), such as, ultra-large scale integrated (ULSI) circuits, can include as many as one million transistors or more. The ULSI circuit can include complementary metal oxide semiconductor (CMOS) field effect transistors (FETS). ICs often include flash memory cells.

Generally, a transistor is covered by a high temperature oxide and an interlevel dielectric to insulate it from subsequently formed metal layers. An aperture or hole is etched through the interlevel dielectric and the high temperature oxide. The hole is filled with a conductive material to provide connections to the transistor, to conductors, or other circuit structures. For example, a contact can extend from the bit line through the interlevel dielectric to the drain of the transistor. In another example, a contact or conductive via can extend through the interlevel dielectric to connect to the gate stack.

As transistors disposed on integrated circuits (ICs) become smaller (e.g., transistors with gate lengths approaching 50 nm), CMOS fabrication processes must scale the dimensions of the transistors. That is, there must be proportional operational characteristics of structural elements in the ultra-small dimensions of a sophisticated transistor.

One problem associated with CMOS scaling involves short channel effects. In U.S. Pat. Nos. 5,985,726 and 6,271,095, both assigned to the assignee of the present disclosure, the formation of ultra-shallow source/drain regions to overcome short channel effects is discussed. Conventional techniques utilize a double implant process to form shallow source and drain extensions. According to the conventional process, the source and drain extensions are formed by providing a transistor gate structure without sidewall spacers on a top surface of a silicon substrate. The silicon substrate is doped on both sides of the gate structure via a conventional doping process, such as, a diffusion process or an ion implantation process. Without the sidewall spacers, the doping process introduces dopants into a thin region (i.e., just below the top surface of the substrate) to form the drain and source extensions as well as to partially form the drain and source regions.

After the drain and source extensions are formed, silicon dioxide spacers, which abut lateral sides of the gate structure, are provided over the source and drain extensions. The substrate is doped a second time to form the deeper source and drain regions. The source and drain extensions are not further doped due to the blocking capability of the silicon dioxide spacer.

As transistors disposed on integrated circuits (ICs) become smaller, transistors with shallow and ultra-shallow source/drain extensions have become more difficult to manufacture. For example, smaller transistors should have ultra-shallow source and drain extensions with less than 30 nanometer (nm) junction depth. Forming source and drain extensions with junction depths of less than 30 nm is very difficult using conventional fabrication techniques. Conventional ion implantation and diffusion-doping techniques make transistors on the IC susceptible to short-channeling effects, which result in a dopant profile tail distribution that extends deep into the substrate. Also, conventional ion implantation techniques have difficulty maintaining shallow source and drain extensions because point defects generated in the bulk semiconductor substrate during ion implantation can cause the dopant to more easily diffuse (transient enhanced diffusion, TED). The diffusion often extends the source and drain extension vertically into the bulk semiconductor substrate.

U.S. Pat. Nos. 5,985,726 and 6,271,095 discuss the use of sacrificial or disposable spacers to surmount problems related to ultra-shallow source/drain extensions and pocket regions. In such processes, annealing processes for the pocket regions and the ultra-shallow extensions can be separated from annealing processing for the deep source and drain regions.

Conventional disposable spacer processes use nitride or oxide spacer materials that can have additional integration concerns. For example, use of nitride or oxide sacrificial spacers can require development of specialized selective etch chemistries and can cause active silicon gouging during spacer removal. Further, conventional disposable spacer processes have utilized conventional photoresist masking process which cannot achieve the resolutions of amorphous carbon processes.

Thus, there is a need to avoid concerns presented by nitride or oxide disposable spacers. Further, there is a need to use amorphous carbon in a disposable spacer process. Even further, there is a need to avoid special spacer etch chemistry and active silicon gouging by using amorphous carbon spacers.

SUMMARY OF THE INVENTION

An exemplary embodiment relates to a method of using amorphous carbon as spacer material in a disposable spacer process. The method can include forming amorphous carbon spacers at lateral side walls of a gate structure over a substrate, implanting dopants in the substrate to form source and drain regions, ashing away the amorphous carbon spacers to provide an aperture, and implanting dopants through the aperture to form shallow structures in the substrate.

Another exemplary embodiment relates to a method of disposable spacer utilization to avoid spacer etch chemistry and active silicon gouging. The method can include patterning a gate over a substrate, forming amorphous carbon spacers adjacent lateral side walls of the gate, forming source and drain regions in the substrate at locations not covered by the amorphous carbon spacer and the gate, removing the amorphous carbon spacers, and forming extension regions in the substrate at locations not covered by the gate.

Another exemplary embodiment relates to a method of forming ultra-shallow junctions using amorphous carbon spacers. The method can include providing amorphous carbon spacers adjacent sides of a gate located over a substrate, implanting source and drain implants to form source and drain regions in the substrate, ashing away the amorphous carbon spacers, activating dopants in the gate, and implant halo and extension implants.

Other principle features and advantages of the invention will become apparent to those skilled in the art upon review of the following drawings, the detailed description, and the appended claims.

BRIEF DESCRIPTION OF THE DRAWINGS

The exemplary embodiments of the disclosure will hereafter be described with reference to the accompanying drawings, wherein like numerals denote like elements, and.

DETAILED DESCRIPTION OF EXEMPLARY EMBODIMENTS

Figure 1:
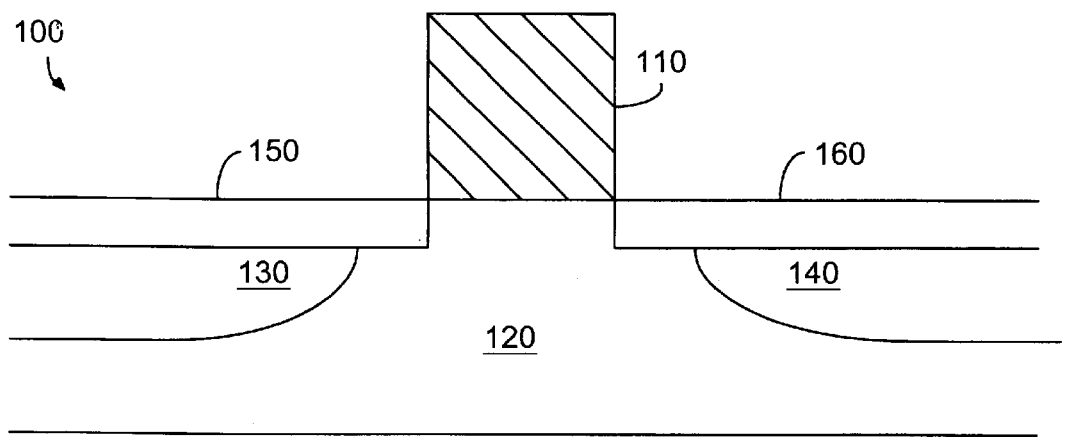
FIG. 1 is a schematic cross-sectional view representation of a portion of an integrated circuit fabricated in accordance with an exemplary embodiment.

Referring to FIG. 1, a portion 100 of an integrated circuit includes a gate 110, a substrate 120, a source region 130, a drain region 140, an extension region 150, and an extension region 160. Gate 110 can be made of polysilicon and can have a critical dimension (i.e., a cross-sectional width) of 0.50 to 100 nm.

Extension regions 150 and 160 can have a depth into substrate 120 of 20–40 nm. Gate 110 can be doped with the same implant used in the formation of source region 130 and drain region 140.

Figure 2:
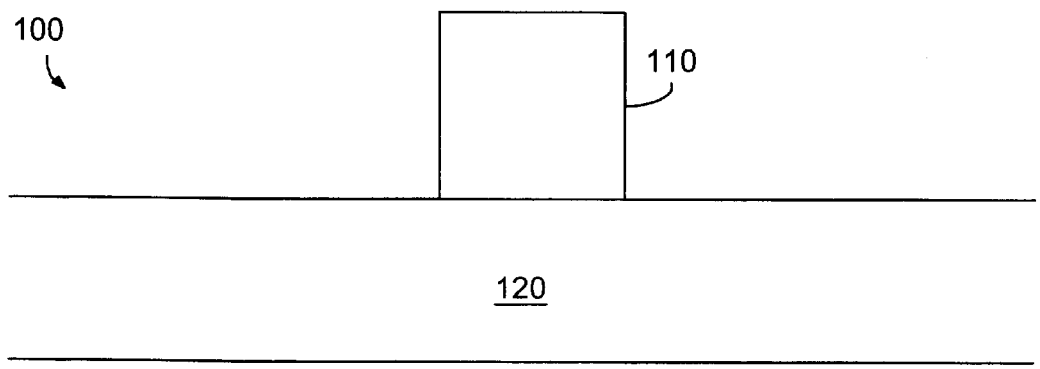
FIG. 2 is a schematic cross-sectional view representation of the portion of the integrated circuit of FIG. 1, showing a gate formation step.

FIG. 2 illustrates a step in the formation of portion 100 described with reference to FIG. 1. Gate 110 is patterned over substrate 120 before any doping procedures. A variety of different patterning techniques can be used to form gate 110. In an exemplary embodiment, gate 110 has a critical dimension (i.e., a cross-sectional width) of 70 nm.

Gate 110 can be made of polysilicon deposited in a low pressure chemical vapor deposition (LPCVD) furnace using a 620° C. silane process. The polysilicon gate thickness can be 1500 to 1700 Angstroms. Following polysilicon deposition, an anti-reflective coating (ARC) is deposited on top of the polysilicon film. Photoresist is deposited and patterned on top of the ARC using DUV lithography to define the transistor gates. Gate 110 is formed by etching the unmasked polysilicon and stopping on the gate oxide. Following gate etch, the photoresist and ARC films are removed.

Figure 3:
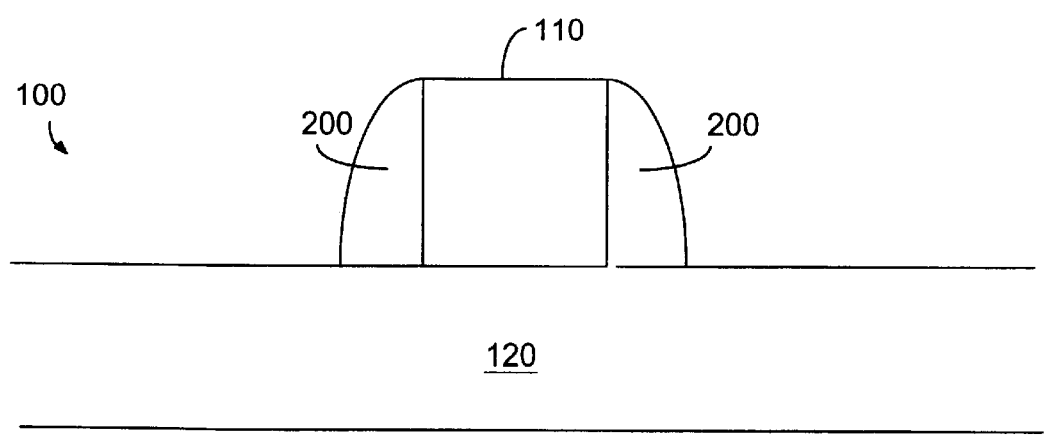
FIG. 3 is a schematic cross-sectional view representation of the portion of the integrated circuit of FIG. 1, showing a spacer formation step.

FIG. 3 illustrates a spacer formation step in which amorphous carbon spacers 200 are formed on lateral side walls of gate 110. Amorphous carbon spacers 200 include amorphous carbon material that enables high/low integration and ultra-shallow junction formation. Advantageously, amorphous carbon used in amorphous carbon spacers 200 is easier to integrate and remove than traditional nitride or oxide spacers. Advantageously, amorphous carbon used in amorphous carbon spacers 200 is easier than remove than conventional nitride or oxide spacers.

In an exemplary embodiment, to form carbon spacers 200, amorphous carbon is deposited as a blanket film with a thickness of 800 to 1000 Angstroms. An anisotropic etchback is then used to define the spacer with a critical dimension (cross-sectional width) of 500 to 600 Angstroms. Amorphous carbon can be deposited using a PECVD process. The amorphous carbon can be deposited pure or with inclusions, such as nitrogen or other inert gases.

Figure 4:
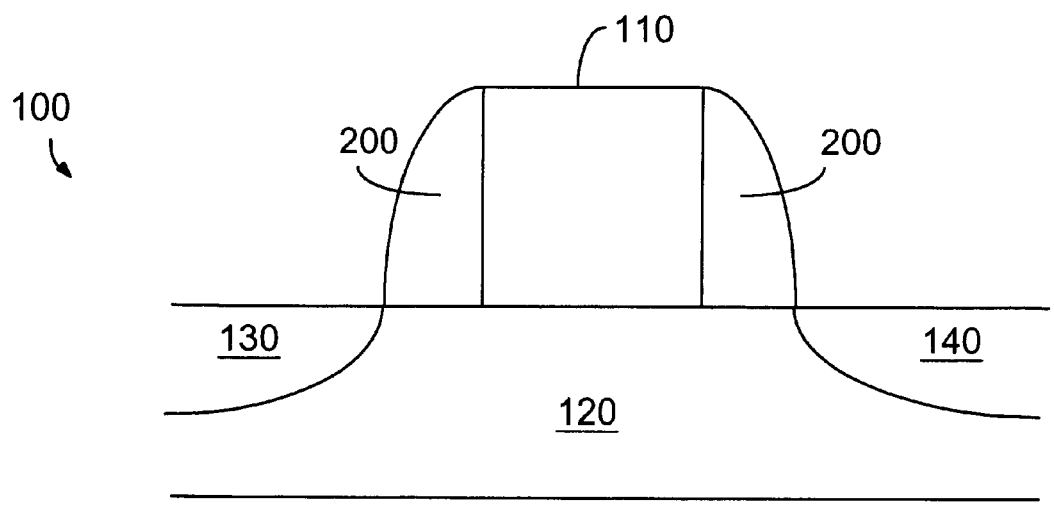
FIG. 4 is a schematic cross-sectional view representation of the portion of the integrated circuit of FIG. 1, showing a source, drain implant step.

FIG. 4 illustrates a source, drain implant in which source region 130 and drain region 140 are formed in substrate 110. In at least one exemplary embodiment, gate 110 can be doped with the source drain implant. The dopant can then be activated with a rapid thermal anneal (RTA).

A high thermal budget process can be used to activate the source/drain dopants. Temperatures on the order of 1000 to 1050° C. can be used. At this point in the processing scheme, no implants have been introduced that may be severely impacted by such high thermal processing, such as halo implant, extension implant or polysilicon doping.

Figure 5:
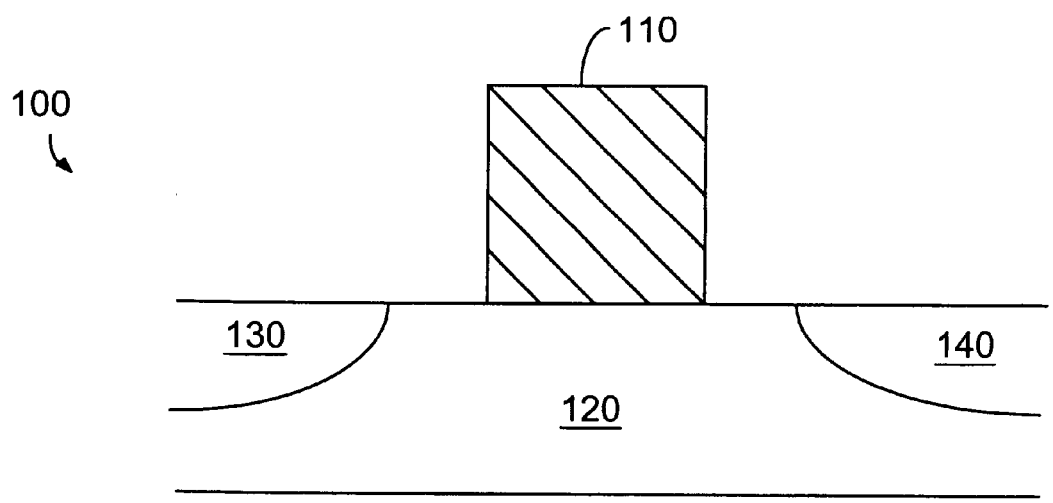
FIG. 5 is a schematic cross-sectional view representation of the portion of the integrated circuit of FIG. 1, showing a spacer removal step.

FIG. 5 illustrates a spacer removal step in which amorphous carbon spacers 200 are removed. In an exemplary embodiment, amorphous carbon spacers 200 are removed by ashing. Ashing can include an $O_2$ plasma that removes amorphous carbon. Advantageously, ashing does not result in active silicon gouging. An oxidizing wet chemistry, such as a sulfuric acid and hydrogen peroxide mixture, can also be used to strip the amorphous carbon film. Alternatively, a dry etch chemistry, possibly using HBr and $Cl_2$, can be developed to remove the amorphous carbon film with selectivity towards silicon.

Referring again to FIG. 1, halo and extension implants are provided to form extension regions 150 and 160. Ultra-shallow junctions are formed using a low thermal budget ($D_t$) process. The halo and extension implant regions can be defined using a offset spacer process from an edge of gate 110. A thin oxide film, on the order of 300 Angstroms is deposited and etched to form the offset spacer with critical dimension (cross-sectional width) of about 200 to 225 Angstroms. The offset spacer provides a margin for subsequent thermal processing so that the extension implant does not over-run the channel region.

In an exemplary embodiment, source region 130 and drain region 140 are doped and activated using a high thermal budget before implanting the extensions. As such extension regions 150 and 160 are not exposed to the high thermal budget used to activate source region 130 and drain region 140. Accordingly, amorphous carbon spacers 200 help in the creation of ultra-shallow junctions that are more shallow than junctions formed in conventional spacer processes because of the required thermal budget. Amorphous carbon spacers 200 are also better than conventional disposable spacers because their removal is much easier.

Alternatively, a layer can be deposited over gate 110, substrate 120, source region 130, drain region 140, and spacers 200. This layer can be, for example, silicon dioxide ($SiO_2$). The layer can be polished down to expose top portions of gate 110 and spacers 200. Spacers 200 can be removed, leaving apertures in the deposited layer through which extension implants can be provided.

Advantageously, use of amorphous carbon in amorphous carbon spacers 200 improves the fabrication process. Unlike conventional spacer materials, amorphous carbon spacers 200 do not require special spacer etch chemistries. Further, no active Si gouging occurs.

While the embodiments illustrated in the FIGURES and described above are presently preferred, it should be understood that the embodiments are offered by way of example only. The invention is not limited to a particular embodiment, but extends to various modifications, combinations, and permutations that nevertheless fall within the scope and spirit of the appended claims.

What is claimed is:

1. A method of using amorphous carbon as spacer material in a disposable spacer process, the method comprising:

forming amorphous carbon spacers at lateral side walls of a gate structure over a substrate;

implanting dopants in the substrate to form source and drain regions;

ashing away the amorphous carbon spacers to provide an aperture; and implanting dopants through the aperture to form shallow structures in the substrate.

2. The method of claim 1, wherein the shallow structures are source and drain extensions.

3. The method of claim 1, wherein the shallow structures are halos.

4. The method of claim 1, wherein implanting dopants through the aperture to form shallow structures includes a low thermal budget process for ultra-shallow junctions.

5. The method of claim 1, wherein ashing away the amorphous carbon spacers does not result in active silicon gouging.

6. The method of claim 1, wherein the gate structure is doped when dopants are implanted in the substrate to form source and drain regions.

7. The method of claim 6, wherein the doped gate structure is activated with a rapid thermal anneal (RTA).

8. The method of claim 1, wherein source and drain junctions formed have a depth of 1200 to 1500 Angstroms.

9. A method of disposable spacer utilization to avoid spacer etch chemistry and active silicon gouging, the method comprising:

patterning a gate over a substrate;

forming amorphous carbon spacers adjacent lateral side walls of the gate;

forming source and drain regions in the substrate at locations not covered by the amorphous carbon spacer and the gate;

removing the amorphous carbon spacers; and forming extension regions in the substrate at locations not covered by the gate.

10. The method of claim 9, wherein forming amorphous carbon spacers includes a chemical vapor deposition (CVD) and etch process.

11. The method of claim 9, wherein the spacers have widths selected to be 500 to 600 Angstroms.

12. The method of claim 9, wherein the extension regions include halo regions.

13. The method of claim 9, wherein the extension regions have depths of 20 to 40 nm.

14. The method of claim 9, wherein the gate is doped when the source and drain regions are formed.

15. A method of forming ultra-shallow junctions using amorphous carbon spacers, the method comprising:

providing amorphous carbon spacers adjacent sides of a gate located over a substrate;

implanting source and drain implants to form source and drain regions in the substrate;

ashing away the amorphous carbon spacers;

activating dopants in the gate; and implant halo and extension implants.

16. The method of claim 15, wherein the gate is doped with the source and drain implant.

17. The method of claim 15, wherein the halo and extension implants have a depth in the substrate of 20 to 40 nm.

18. The method of claim 15, wherein the amorphous carbon spacers have widths of 500 to 600 Angstroms.

19. The method of claim 15, wherein activating dopants in the gate includes providing a rapid thermal anneal (RTA).

20. The method of claim 15, wherein the gate has a width of 0.50 to 100 nm.

* * * * *